| United States Patent [19] | [11] Patent Number: 4,728,681 |
| Kobayashi et al. | [45] Date of Patent: Mar. 1, 1988 |

[54] COATING COMPOSITIONS FOR PRINTED CIRCUIT BOARDS

[75] Inventors: Tsutomu Kobayashi; Masato Kokusho, both of Hiratsuka, Japan

[73] Assignee: The Yokohama Rubber Co., Ltd., Tokyo, Japan

[21] Appl. No.: 13,245

[22] Filed: Feb. 10, 1987

[30] Foreign Application Priority Data

Feb. 10, 1986 [JP]  Japan .................................. 61-25715
Jun. 2, 1986 [JP]  Japan ................................ 61-125616

[51] Int. Cl.$^4$ ................................................ C08K 3/30
[52] U.S. Cl. .................................... 523/411; 523/413; 523/457; 524/423; 524/509
[58] Field of Search ....................... 523/411, 413, 457; 524/423, 509

[56] References Cited

U.S. PATENT DOCUMENTS 4,166,162  8/1979  Weissenfels et al. ............... 524/423
4,379,873  4/1983  Wilson ................................ 524/423

FOREIGN PATENT DOCUMENTS 52-31539  8/1977  Japan .

*Primary Examiner*—Lewis T. Jacobs
*Attorney, Agent, or Firm*—Finnegan, Henderson, Farabow, Garrett & Dunner

[57] ABSTRACT

Coating compositions are disclosed which are effectively applicable to the plating of insulating bases for use in manufacturing printed circuit boards by the additive process. Selected composite rubber materials are combined with specified amounts of a selected type of calcium sulfate, whereby blister resistance by plating, heat resistance at soldering and peel strength are greatly improved.

8 Claims, No Drawings

COATING COMPOSITIONS FOR PRINTED CIRCUIT BOARDS

BACKGROUND OF THE INVENTION

1. Field of the Invention

This invention relates to coating compositions for use in the production of printed circuit boards by the additive process.

2. Prior Art

There have heretofore been proposed printed circuit boards formed by disposing conductive circuit patterns on insulating substrates or base plates by the additive process. These known circuit boards find wide application to parts for use with electrical facilities and equipment. In the manufacture of the printed circuit boards, coating compositions consisting essentially of acrylonitrile/butadiene rubbers, phenolic resins and epoxy resins are applied on to insulating base plates made such as of an epoxy or imide resin or a ceramic material. After being cured or semi-cured, the coated plates on their surfaces are made hydrophilic or coarse with a mixture of chromic acid and sulfuric acid, followed by catalytic action with palladium chloride or the like. The plates are protected at portions where no circuit patterns are required, by photographic masking with use of a photosensitive lacquer, i.e. by photoresist formation with use of a screen printing technique. The plates so masked are electroless-plated at portions where printed circuitry is desired and subsequently dried.

Such prior art compositions, however, are encountered with blistering on the plated surfaces and also with reduced heat resistance at soldering. To cope with these problems, the compositions have been combined with silica as disclosed for instance in Japanese Patent Publication No. 52-31539 or with a filler such as clay. Silica has been found to be totally unsatisfactory in respect of heat resistance at soldering. In the meantime, clay causes, depending upon the conditions of etching, reduced blister resistance and insufficient heat resistance particularly in the case of glass-epoxy substrates. This has created an urgent need for improved coating compositions which are capable of giving printed circuit boards with good physical properties.

SUMMARY OF THE INVENTION

It has now been found that coating compositions blessed with excellent quality characteristics can be obtained by the use of a selected type of calcium sulfate combined with composite rubber materials.

It is the primary object of the present invention to provide a novel coating composition which exhibits excellent blister resistance by plating, high heat resistance at soldering and sufficient peel strength.

This and other objects and advantages of the invention can be achieved by the provision of a coating composition for use in the manufacture of printed circuit boards, which comprises a composite rubber material comprising a rubber and a phenolic resin, and calcium sulfate in an amount of 3–50 parts by weight of 100 parts of that rubber material.

PREFERRED EMBODIMENTS OF THE INVENTION

Coating compositions of the present invention comprise composite rubber materials and calcium sulfate. Composite rubber materials eligible for the purpose of the invention are composed of rubbers and phenolic resins. The rubbers include for example natural rubbers (NR), styrene/butadiene copolymer rubbers (SBR), acrylonitrile/butadiene copolymer rubbers (NBR) and the like. Where the NBR rubbers are used, there is no restriction imposed upon the nitriles contents; that is, such contents may be as low as 25% or smaller or as high as 43% or greater. Alternatively, the NBR rubbers may be of a carboxylated type. Specific examples of the phenolic resins include not only novolak phenol resins and resol phenol resins but also modified phenol resins in the form of alkyl cresols, cashews and the like.

Epoxy resins may be incorporated, where desired, in the coating compositions. Eligible examples of the epoxy resins include bisphenol A, novolak epoxy resins and the like.

Importantly, a certain type of calcium sulfate is combined with the composite rubber materials. Eligible types of calcium sulfate may be selected from those commercially available. Alpha-type $CaSO_4.\frac{1}{2}H_2O$ and II-type $CaSO_4$ anhydride are particularly desired for their higher crystalline density than other types of calcium sulfate and hence are highly resistant to attack by plating solutions.

The amount of calicum sulfate to be added should be in the range of 3–50 parts by weight of 100 parts of the composite rubber material. Smaller than 3 parts by weight would invite insufficient heat resistance at soldering and reduced blister resistance by plating. Greater amounts than 50 parts by weight would make the plated surface too coarse, failing to give precise circuit pattern.

As regards the composite rubber materials, the weight ratio of rubber to phenolic resin should suitably be 70–40 to 30–60. Where an epoxy resin is employed, the weight ratio of these three components is 60–40 to 30–50 to 10.

There may be used other additives such as cross-linking agents, curing agents, leveling agents, solvents and the like.

The following formulation is typical of and practical for the invention.

| Material | Part (by weight) |
| --- | --- |
| rubber | 70–40 |
| phenolic resin | 30–50 |
| epoxy resin | 0–10 |
| calcium sulfate | 3–50 |

The following examples are given to further illustrate the present invention, but it is to be understood that the invention is not limited thereto. In these examples all parts are by weight unless specifically noted.

EXAMPLE 1

A coating composition according to the invention was formulated and prepared as follows:

| Material | Part |
| --- | --- |
| NBR (Nipol 1072, carboxylated NBR, Nippon Zeon Co.) | 60 |
| phenolic resin (PR-175, ammonia-resol phenol resin, Sumitomo Durez Co.) | 35 |
| epoxy resin (Epikote-1001, BPA epoxy resin, Yuka-Shell Epoxy Co.) | 5 |
| calcium sulfate ($CaSO_4.\frac{1}{2}H_2O$, type: alpha, particle size: 100-mesh pass 99.9%, 350-mesh pass 68%) | 15 |

| Material | Part |
|---|---|
| t-butylperoxybenzoate | 6 |
| leveling agent | 0.5 |
| defoaming agent | 0.1 |

A solution of the above composition in 25% methyl ethyl ketone (MEK) was applied on to a paper-phenol substrate (XPC-FR) and a glass-epoxy substrate (FR-4), respectively, on a bar coater in a dry thickness of 40 micron. The resulting substrates were cured at 150° C. for one hour, followed by etching with a chromic acid mixture ($CrO_3$: 100 g/l, concentrated $H_2SO_4$: 300 ml/g) at 50° C. for 10 minutes. After being catalyzed with Cataposit 44 and Cataprip 404 (Shipley Inc.), the etched substrates were plated at 70° C. for 13 hours with use of an electroless plating solution (pretreated with Accelerator 19, Hitachi Co., Japanese Patent Publication No. 56-27594) and subsequently dried at 120° C. for 2 hours thereby obtaining a test piece.

COMPARATIVE EXAMPLE 1

The procedure of Example 1 was followed except that silica ($SiO_2$, type: amorphous, synthetic, particle size: 25 micron) was used instead of calcium sulfate.

COMPARATIVE EXAMPLE 2

The procedure of Example 1 was followed except that clay (type: acidic, hydrous, $SiO_2$: 45%, $Al_2O_3$: 38%, water of crystallization: 14%, particle size: 0.8 micron) was used instead of calcium sulfate.

Each of the test pieces provided in Example 1 and Comparative Examples 1 and 2 was tested for blister resistance by plating, peel strength and heat resistance at soldering under the conditions given below and with the results shown in Table 1.

Blister Resistance

Surface roughness (Rmax) was measured in accordance with JIS B0651 and JIS B0601. Below 15 micron is positive and above 25 micron negative.

Peel Strength

JIS C6481 was followed. Above 2 kg/cm is desirable.

Heat Resistance

Measurement was made in accordance with JIS C6481. Desired are above 20 seconds at 260° C. in the case of paper-phenol substrates and above 180 seconds at 260° C. in the case of glass-epoxy substrates.

EXAMPLE 2

Another coating composition according to the invention was prepared using the same formulation as in Example 1 except that the particle size of alpha-type $CaSO_4.\frac{1}{2}H_2O$ was changed to 5 micron in place of 100-mesh pass 99.9% and 350-mesh pass 68%.

EXAMPLE 3

The procedure of Example 2 was followed except that II-type $CaSO_4$ anhydride (particle size: 8 micron) was substituted for alpha-type $CaSO_4.\frac{1}{2}H_2O$ (particle size: 5 micron).

EXAMPLE 4

The procedure of Example 3 was followed except that the amount of calcium sulfate was changed to 30 parts in place of 15 parts.

EXAMPLE 5

The procedure of Example 2 was followed except that alpha-type $CaSO_4.2H_2O$ was substituted for alpha-type $CaSO_4.\frac{1}{2}H_2O$.

EXAMPLE 6

The procedure of Example 2 was followed except that beta-type $CaSO_4.\frac{1}{2}H_2O$ (particle size: 8 micron) was substituted for alpha-type $CaSO_4.\frac{1}{2}H_2O$ (particle size: 5 micron).

COMPARATIVE EXAMPLE 3

The procedure of Example 2 was followed except that silica (type: amorphous, synthetic, particle size: 2.5 micron) was used instead of calcium sulfate.

COMPARATIVE EXAMPLE 4

The procedure of Example 2 was followed except that clay (type: acidic, hydrous, $SiO_4$: 45%, $Al_2O_3$: 38%, water of crystallization: 14%, particle size: 0.8 micron) was used instead of calcium sulfate.

The same performance tests as in Example 1 were made for all the test pieces obtained in Examples 2 to 6 and Comparative Examples 3 and 4 with the results shown in Table 2.

It is to be noted as appears clear from Tables 1 and 2 that the coating compositions embodying Examples 1 to 4 are highly satisfactory in respect of all the performance characteristics tested. The controls in Comparative Examples 1 and 2 revealed blistering in the case of the glass-epoxy substrates, failing to give acceptable heat resistance and sufficient peel strength in the case of the paper-phenol substrates. The controls of Comparative Examples 3 and 4 were comparable with the controls of Comparative Examples 1 and 2 in the case of the glass-epoxy substrates. As is apparent from Examples 5 and 6, alpha-type $CaSO_4.2H_2O$ and beta-type $CaSO_4.\frac{1}{2}H_2O$ have been found to be less effective in blister resistance in the case of the glass-epoxy substrates than alpha-type $CaSO_4.\frac{1}{2}H_2O$ and II-type $CaSO_4$ anhydride.

TABLE 1

| performance | Example 1 GE[1] | Example 1 PP[2] | Comparative Example 1 GE | Comparative Example 1 PP | Comparative Example 2 GE | Comparative Example 2 PP |
|---|---|---|---|---|---|---|
| blister resistance[3] | o | o | x | o | x | o |
| peel strength (kg/cm) | 2.5 | 2.6 | 1.5 | 2.0 | 1.7 | 2.1 |
| heat resistance at soldering (sec.) | <180 | <70 | 18 | 29 | 20 | 70 |

[1] glass-epoxy substrate
[2] paper-phenol substrate
[3] surface roughness (Rmax)
o: positive (less than 15 micron)
x: negative (more than 25 micron)

TABLE 2

| performance | Example 2 GE[1] | Example 2 PP[2] | Example 3 GE | Example 3 PP | Example 4 GE | Example 4 PP | Example 5 GE | Example 5 PP | Example 6 GE | Example 6 PP | Comparative Example 3 GE | Comparative Example 3 PP | Comparative Example 4 GE | Comparative Example 4 PP |
|---|---|---|---|---|---|---|---|---|---|---|---|---|---|---|
| bliste | o | o | o | o | o | o | △ | o | △ | o | x | o | x | o |

TABLE 2-continued

| performance | Example | | | | | | | | | | Comparative Example | | | |
| --- | --- | --- | --- | --- | --- | --- | --- | --- | --- | --- | --- | --- | --- | --- |
| | 2 | | 3 | | 4 | | 5 | | 6 | | 3 | | 4 | |
| | GE[1] | PP[2] | GE | PP | GE | PP | GE | PP | GE | PP | GE | PP | GE | PP |
| resistance[3] | | | | | | | | | | | | | | |
| peel strength (kg/cm) | 2.5 | 2.6 | 2.6 | 2.8 | 2.4 | 2.6 | 2.6 | 1.2 | 2.0 | 1.1 | 1.5 | 2.0 | 1.7 | 2.1 |
| heat resistance at soldering (sec.) | <180 | 70 | <180 | 60 | <180 | 70 | 60 | 80 | 70 | 60 | 18 | 27 | 20 | 70 |

[1] glass-epoxy substrate
[2] paper-phenol substrate
[3] surface roughness (Rmax)
o: positive (less than 15 micron)
Δ: moderate (15-25 micron)
x: negative (more than 25 micron)

What is claimed is:

1. A coating composition for use in the manufacture of printed circuit boards, which comprises a composite rubber material comprising a rubber and a phenolic resin, and calcium sulfate in an amount of 3-50 parts by weight of 100 parts of said rubber material.

2. The coating composition according to claim 1 wherein said calcium sulfate is alpha-type $CaSO_4 \cdot \frac{1}{2}H_2O$ or II-type $CaSO_4$ anhydride.

3. The coating composition according to claim 1 wherein said rubber material further includes an epoxy resin.

4. The coating composition according to claim 1 wherein said rubber is natural rubber, styrene/butadiene rubber or acrylonitrile/butadiene rubber.

5. The coating composition according to claim 1 wherein said phenolic resin is novolak phenol resin or resol phenol resin.

6. The coating composition according to claim 3 wherein said epoxy resin is bisphenol A or novolak epoxy resin.

7. The coating composition according to claim 1 wherein the weight ratio of rubber to phenolic resin is 70-40 to 30-60.

8. The coating composition according to claim 3 wherein the weight ratio of rubber to phenolic resin to epoxy resin is 60-40 to 30-50 to 10.

* * * * *